United States Patent
Kamada (10) Patent No.: US 7,910,946 B2
(45) Date of Patent: Mar. 22, 2011

(54) LIGHT EMITTING APPARATUS AND SEMICONDUCTOR APPARATUS, AND METHOD FOR MANUFACTURING THE SAME

(75) Inventor: Kazuhiro Kamada, Anan (JP)

(73) Assignee: Nichia Corporation, Anan-shi (JP)

( * ) Notice: Subject to any disclaimer, the term of this patent is extended or adjusted under 35 U.S.C. 154(b) by 150 days.

(21) Appl. No.: 12/097,208

(22) PCT Filed: Oct. 27, 2006

(86) PCT No.: PCT/JP2006/321536
§ 371 (c)(1),
(2), (4) Date: Aug. 12, 2008

(87) PCT Pub. No.: WO2007/069399
PCT Pub. Date: Jun. 21, 2007

(65) Prior Publication Data
US 2009/0289268 A1    Nov. 26, 2009

(30) Foreign Application Priority Data

Dec. 12, 2005 (JP) ................... 2005-357200

(51) Int. Cl.
*H01L 33/00* (2010.01)
*H01L 23/48* (2010.01)
(52) U.S. Cl. ............ 257/99; 257/98; 257/690; 257/712; 257/E33.056; 257/E33.059; 257/E23.08; 257/E23.01
(58) Field of Classification Search .................. 257/99, 257/98, 690, 712, E33.056, E33.059, E23.08, 257/E23.01
See application file for complete search history.

(56) References Cited

U.S. PATENT DOCUMENTS

| | | | | |
|---|---|---|---|---|
| 6,054,716 A | * | 4/2000 | Sonobe et al. | 250/552 |
| 2004/0256706 A1 | | 12/2004 | Nakashima | |
| 2005/0135105 A1 | * | 6/2005 | Teixeira et al. | 362/294 |
| 2006/0133044 A1 | * | 6/2006 | Kim et al. | 361/704 |
| 2007/0063321 A1 | * | 3/2007 | Han et al. | 257/675 |

FOREIGN PATENT DOCUMENTS

| | | |
|---|---|---|
| DE | 4017697 A1 | 12/1991 |
| EP | 1544924 A2 | 6/2005 |
| JP | 10-12788 A | 1/1998 |
| JP | 2004-296989 A | 10/2004 |
| JP | 3109109 U | 3/2005 |
| JP | 2006-173561 A | 6/2006 |
| JP | 2006-229205 A | 8/2006 |
| WO | WO 02/084749 A2 | 10/2002 |

OTHER PUBLICATIONS

European Search Report issued Jul. 22, 2010, in EP No. 06822497.1.

* cited by examiner

*Primary Examiner* — Ngan Ngo
*Assistant Examiner* — Benjamin Tzu-Hung Liu
(74) *Attorney, Agent, or Firm* — Birch, Stewart, Kolasch & Birch, LLP (57) ABSTRACT

A semiconductor apparatus and a light emitting apparatus which are capable of efficiently dissipating the heat generated by a semiconductor device and have high reliability, and a method for manufacturing the same are provided.

The light emitting apparatus comprises a light emitting device, a heat dissipating member that has an upper surface and a lower surface and supports the light emitting device mounted on the upper surface, first and second leads and an insulating resin that holds the first and second leads at positions isolated from the heat dissipating member, wherein an inner lead of the first lead and an inner lead of the second lead are held at positions lower than the upper surface and higher than the lower surface.

16 Claims, 7 Drawing Sheets

*Fig. 7*

# LIGHT EMITTING APPARATUS AND SEMICONDUCTOR APPARATUS, AND METHOD FOR MANUFACTURING THE SAME

TECHNICAL FIELD

The present invention relates to a semiconductor apparatus including a semiconductor device, and particularly to a light emitting apparatus that uses a light emitting device for the semiconductor device, and a method for manufacturing the same.

BACKGROUND ART

Figure 7:
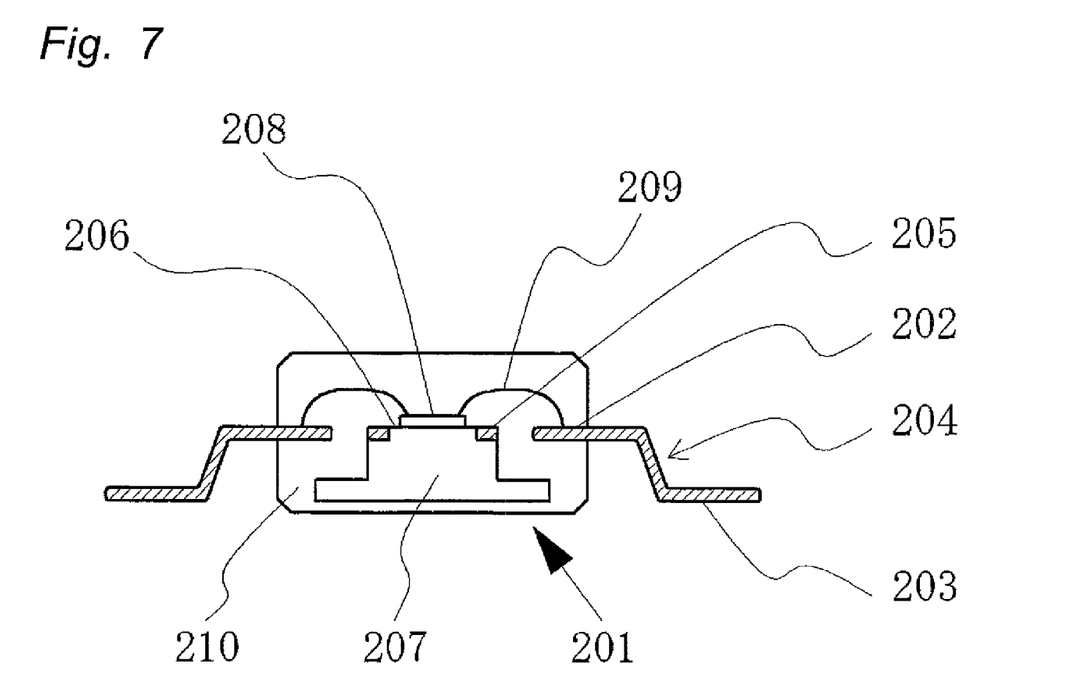
FIG. 7 is a sectional view showing the semiconductor apparatus of the prior art.

The recent trend of semiconductor apparatuses and light emitting apparatuses toward higher output power has produced semiconductor apparatuses such as a light emitting diode (hereinafter referred to as LED) that generate several Watts of heat, which gives increasing significance to the technology to efficiently dissipate the heat generated by the semiconductor devices. FIG. 7 is a sectional view of a semiconductor apparatus of the prior art disclosed in Japanese Unexamined Patent Publication (Kokai) No. 10-12788. This semiconductor apparatus has an improved efficiency of heat dissipation by mounting a semiconductor device on a heat sink and molding the device with a resin.

In FIG. 7, reference numeral 201 denotes the semiconductor apparatus, 202 denotes an inner lead, 203 denotes an outer lead, 204 denotes a lead frame, 205 denotes a tab, 206 denotes an aperture, 207 denotes a heat sink, 208 denotes a semiconductor device, 209 denotes an electrically conductive wire and 210 denotes an insulating resin.

DISCLOSURE OF INVENTION

However, the light emitting apparatus that uses a light emitting device of high output power as the semiconductor device made in the constitution of the conventional semiconductor apparatus has such a problem that high reliability cannot be ensured due to the possibility of wire breakage or other trouble.

In order to solve the problem described above, the present invention provides a light emitting apparatus comprising a light emitting device, a heat dissipating member that has an upper surface and a lower surface and supports the light emitting device mounted on the upper surface, first and second leads and an insulating resin that holds the first and second leads at positions separate from the heat dissipating member, wherein an inner lead of the first lead and an inner lead of the second lead are held at positions lower than the upper surface and higher than the lower surface.

It is preferable that the light emitting apparatus of the present invention further has a metal tab fitted into the circumference of the heat dissipating member, and that the surface of the metal tab is located at a position lower than the upper surface of the heat dissipating member.

In the light emitting apparatus of the present invention, the semiconductor device may be mounted on the surface of the metal tab.

In the light emitting apparatus of the present invention, the insulating resin may have a guide wall that surrounds a portion of a side face of the heat dissipating member located above the inner lead of the first lead and the inner lead of the second lead, and that has a distal end located at a position lower than the upper surface of the heat dissipating member.

The light emitting apparatus of the present invention may have such a constitution as the guide wall and the side face of the heat dissipating member form an annular recess that surrounds the heat dissipating member, and the surface of the inner lead of the first lead, the surface of the inner lead of the second lead and the surface of the metal tab are placed at the bottom of the recess.

In the light emitting apparatus of the present invention, a housing recess for housing the light emitting device may be formed on the upper surface of the heat dissipating member.

In the light emitting apparatus of the present invention, it is preferable to further provide a translucent cover member that covers the light emitting device and for at least a part of the surface of the translucent cover member to be a spherical surface.

In the light emitting apparatus of the present invention, it is preferable to form a portion of the translucent cover member below the spherical surface in a cylindrical shape.

A first semiconductor apparatus of the present invention comprises a semiconductor device, a heat dissipating member whereon the semiconductor device is mounted, leads that are electrically connected to the semiconductor device, a tab having an aperture wherein the heat dissipating member is inserted and an insulating resin that allows one end of the leads to be exposed therefrom and fastens at least a part of the leads and the heat dissipating member therein, wherein a flange is formed on the aperture of the tab, and the heat dissipating member is attached in the aperture that has the flange formed thereon so that the device mounting area of the heat dissipating member faces upward. This constitution provides a semiconductor apparatus having a high heat dissipation effect. Integrating the heat dissipating member on the flange of the lead frame by pressure attachment makes it possible to prevent the lead frame from deforming as the tab is not directly subject to the stress generated by the pressure attachment.

It is preferable that the lower surface of the heat dissipating member is exposed from the insulating resin.

It is preferable that the device mounting area of the heat dissipating member has a protrusion or a recess to prevent the device from coming off the tab.

A method for manufacturing the light emitting apparatus of the present invention comprises a step of forming the frame, the lead extending inward from the frame and the tab, a step of forming the aperture that penetrates the tab region vertically, a step of applying a burring process to the aperture so as to form a flange on the aperture that extends from the back of the aperture either upward or downward, a step of inserting a heat dissipating member into the aperture and attaching the heat dissipating member to the tab, a step of fastening a part of the lead and the heat dissipating member with an insulating resin, and a step of mounting a semiconductor device on the heat dissipating member. According to this method, since the burring process of the lead frame leads to the formation of R called a fillet at the position of the aperture where the heat dissipating member is inserted, this provides a guide for inserting the heat dissipating member and the heat dissipating member can be inserted into the aperture without a special guide. Also because the heat dissipating member makes surface contact with the flange of the lead frame, the contact area is large, which improves the heat dissipating capacity and provides high positional accuracy.

A second semiconductor apparatus of the present invention comprises a semiconductor device, a heat dissipating member whereon the semiconductor device is mounted, leads that are electrically connected to the semiconductor device, a tab having an aperture formed therein into which the heat dissipating member is inserted and an insulating resin that allows one end of the leads to be exposed therefrom and fastens at least a part of the leads and the heat dissipating member therein, wherein a protective device is mounted on the tab, the protective device and the leads are electrically connected to each other, and the heat dissipating member is mounted in the aperture of the tab. This constitution provides a semiconductor apparatus having a high heat dissipation effect. Also the electrical connection with the leads can be established through the tab whereon the protective device is mounted.

Since the tab is not in contact with the lead, transfer of heat generated by the semiconductor device to the leads becomes difficult so that the electrical resistance of the lead due to the heat decreases.

The protective device and the leads are electrically connected to each other via a wire that does not pass over the semiconductor device. While the wire is prone to breakage due to expansion and contraction of a silicone resin when the semiconductor device is covered with a silicone resin or the like, the constitution of the present invention prevents the wire from breaking. It is possible to prevent short-circuiting from occurring between the wire that connects the semiconductor device and the leads and the wire that connects the protective device and the leads.

The tab and the leads are electrically connected to each other via a wire which does not pass over the semiconductor device. This constitution prevents the wire from breaking. It is possible to prevent short-circuiting from occurring between the wire that connects the semiconductor device with the leads and the wire that connects the protective device with the leads.

The heat dissipating member has a stepwise construction having at least a top level, a mid level and a bottom level, where the top level preferably has a size substantially the same as or less than that of the aperture of the tab. This construction increases the force of engagement between the heat dissipating member and the tab.

It is preferable that the heat dissipating member has a device mounting area where the semiconductor device is mounted, and the device mounting area protrudes beyond the tab. When a light emitting diode is used as the semiconductor device, this construction enables the light emitted by the light emitting diode to emerge to the outside without being blocked by the tab.

It is preferable that the heat dissipating member has a device mounting area where the semiconductor device is mounted, and the device mounting area protrudes beyond the insulating resin. When a light emitting diode is used as the semiconductor device, this construction enables the light emitted by the light emitting diode to emerge to the outside without being blocked by the insulating resin.

It is preferable that the side face of the heat dissipating member has a protrusion or a recess formed thereon so as to prevent the tab from coming off. This construction enables preventing the tab from coming off and reducing the possibility of breaking of wires that connect between the semiconductor device and the leads and between the protective device and the leads.

It is preferable that the lower surface of the heat dissipating member is exposed from the insulating resin, so that heat dissipation is improved.

In the first and second semiconductor apparatuses, it is preferable that the semiconductor device is a light emitting diode.

The present invention provides a semiconductor apparatus and a light emitting apparatus which are capable of efficiently dissipating the heat generated by a semiconductor device and have high reliability, and a method for manufacturing the same.

BRIEF DESCRIPTION OF REFERENCE NUMERALS

1: Lead frame
2, 102: Inner lead
3, 103: Outer lead
4: Tie bar
5, 105: Tab
5a: Flange
6, 106: Aperture
7, 107: Heat dissipating member
7a, 107a: Device mounting area
8: Punch
9: Die
100: Light emitting apparatus
107a: Device mounting area (Upper surface)
107b: Mid level
107c: Bottom level
107d: Side face
107e: Lower surface
110: Light emitting diode
111: Protective device 115: Insulating resin
116: Translucent cover member

BEST MODE FOR CARRYING OUT THE
INVENTION

An embodiment of the present invention will now be described with reference to the accompanying drawings.

Embodiment

Figure 1:
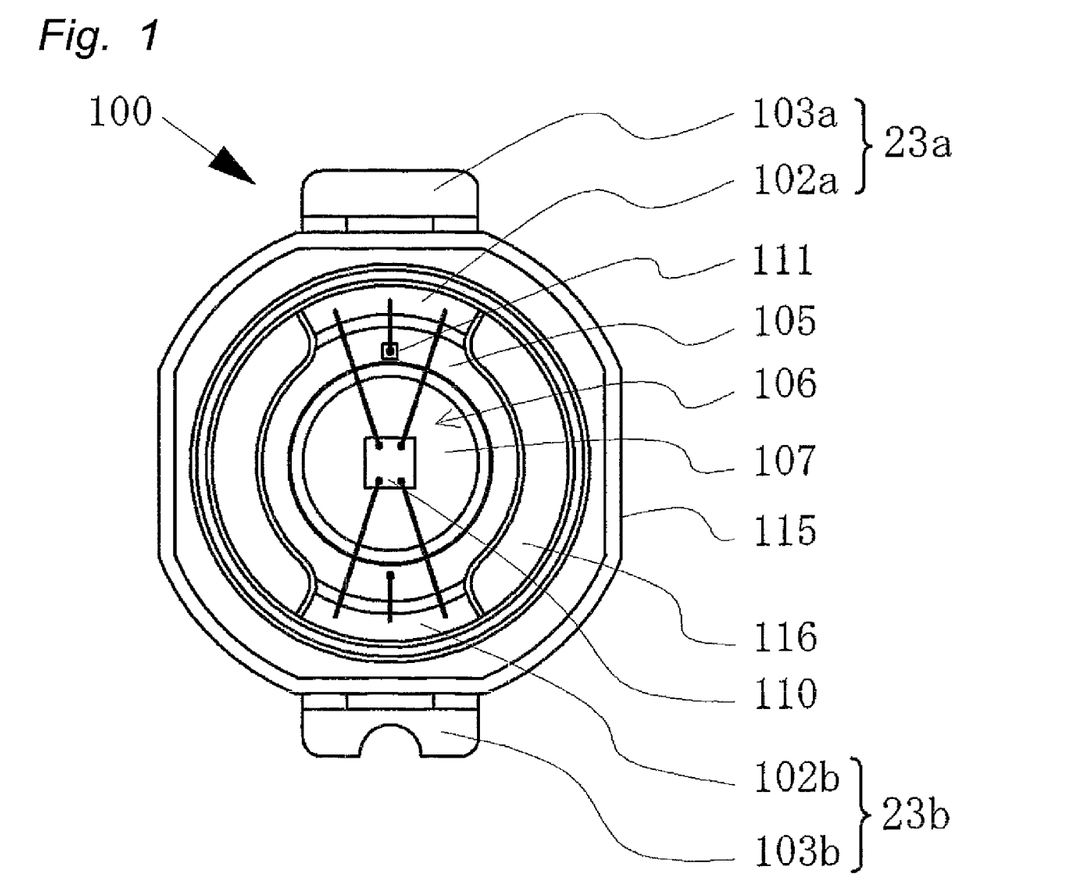
FIG. 1 is a front view showing the constitution of the light emitting apparatus according to an embodiment of the present invention.
Figure 2:
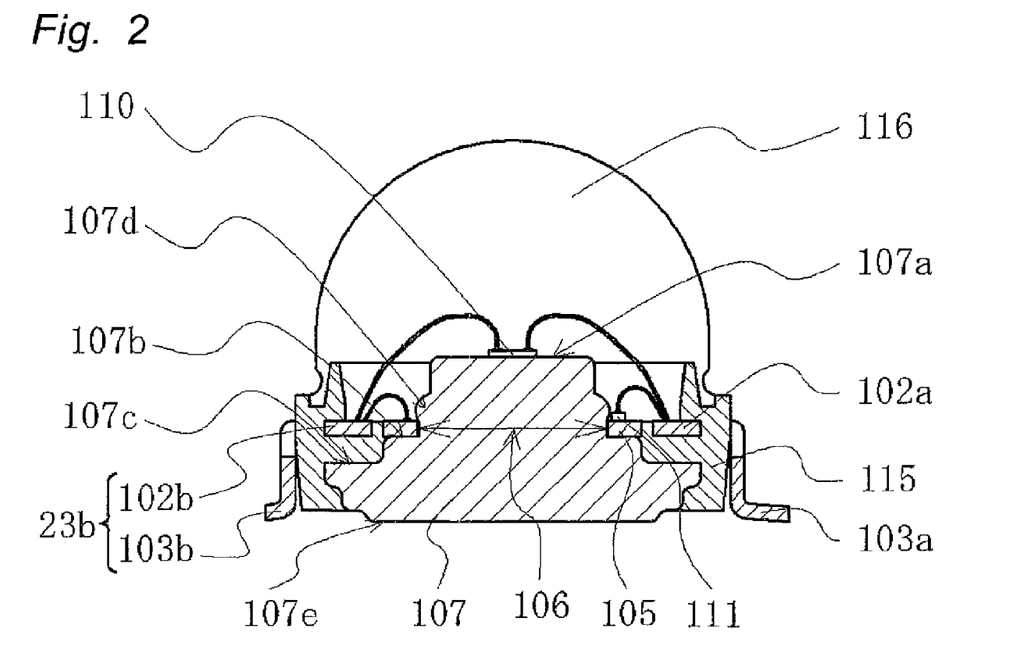
FIG. 2 is a schematic sectional view showing the constitution of the light emitting apparatus of the embodiment.

A semiconductor apparatus according to the embodiment will be described with reference to the accompanying drawings. FIG. 1 is a plan view of the semiconductor apparatus [M1] according to the embodiment. FIG. 2 is a schematic sectional view of the semiconductor apparatus according to the embodiment.

The semiconductor apparatus of this embodiment is a semiconductor apparatus that employs a light emitting device as the semiconductor device, and has a constitution as described below.

In the semiconductor apparatus of this embodiment, a light emitting device 110 is mounted on the upper surface of a heat dissipating member 107. An annular metal tab 105 is fitted onto the outer circumferential face of the heat dissipating member 107 so that the upper surface thereof becomes lower than the upper surface of the heat dissipating member 107. A first lead 23a and a second lead 23b are held outside of the metal tab 105 by an insulating resin in a position separated from the metal tab 105. An inner lead 102a of the first lead 23a and an inner lead 102b of the second lead 23b are held at a position lower than the upper surface of the heat dissipating member 107 and higher than the lower [N2] surface of the heat dissipating member 107. Thus in the light emitting apparatus of the embodiment, the upper surface of the metal tab 105, the upper surface of the inner lead 102a and the upper surface of the inner lead 102b that are connected by wires are located at lower positions than the upper surface of the heat dissipating member 107.

The insulating resin 115 has a guide wall that surrounds a portion of the outer circumferential side face of the heat dissipating member 107 that is located higher than the upper surface of the inner lead 102a and the upper surface of the inner lead 102b, so that the guide wall and the circumferential side face of the heat dissipating member form a recess that surrounds the heat dissipating member 107. The surface of the inner lead 102a, the surface of the inner lead 102b and the surface of the metal tab are exposed on the bottom surface of the recess, to allow bonding and mounting of a semiconductor device (a semiconductor device other than the light emitting device) on the exposed surfaces. The semiconductor apparatus of this embodiment has a protective device (zener diode) 111 mounted on the metal tab that is exposed in the recess, so as to keep the light emitting device from being subject to a surge voltage. In this embodiment, the guide wall of the insulating resin is formed in such a configuration as the distal end thereof is located lower than the upper surface of the heat dissipating member 107, so that the light emitted from a side face of the light emitting device that is mounted on the upper surface of the heat dissipating member 107 is not be blocked by the guide wall of the insulating resin.

In the light emitting apparatus of this embodiment comprising the heat dissipating member 106, the light emitting device 110, the first and second leads 23a, 23b and the metal tab 105 disposed as described above, predetermined wirings are provided by wire bonding.

The inner lead 102a exposed on the bottom surface of the recess and one of the electrodes of the light emitting device 110 are connected to each other by a wire.

The other electrode of the light emitting device 110 and the inner lead 102b exposed on the bottom surface of the recess are connected to each other by a wire.

The inner lead 102a exposed on the lower surface of the recess and the electrode formed on the upper surface of the protective device 111 are connected to each other by a wire.

The electrode formed on the lower surface of the protective device 111 is connected to the metal tab 105 by means of, for example, an electrically conductive adhesive.

The inner lead 102b exposed on the bottom surface of the recess and the metal tab 105 are connected to each other by a wire.

By wiring as described above, a zener diode used as the protective device 111 and the light emitting device are connected in parallel between the first lead 23a and the second lead 23b.

In the light emitting apparatus of the embodiment, a translucent resin is provided in a dome shape so as to cover the light emitting device 110 and the wires. The translucent resin also fills the inside of a groove, so that the metal tab exposed at the bottom of the groove, the inner lead 102a exposed on the bottom surface of the recess, the inner lead 102b exposed on the bottom surface of the recess and the protective device 111 are also covered by the translucent resin.

The heat dissipating member 107 is provided so that the lower surface of the heat dissipating member 107 directly contacts a substrate when, for example, the light emitting apparatus is mounted on the substrate. That is, the lower surface of the heat dissipating member 107 and the lower surface of the outer lead are disposed in substantially the same plane.

In the light emitting apparatus of the embodiment constituted as described above, a good heat dissipating characteristic can be provided since the light emitting device 110 is mounted directly on the heat dissipating member and the lower surface 107e of the heat dissipating member 107 makes direct contact with the substrate when the light emitting apparatus is mounted on the substrate.

In the light emitting apparatus of the embodiment constituted as described above, since the inner lead 102a of the first lead 23a and the inner lead 102b of the second lead 23b are bonded at positions lower than an upper surface 107a of the heat dissipating member 107 whereon the light emitting device 110 is mounted, the wires are less susceptible to the influence (stress) of expansion and contraction of the translucent cover member 116 due to heat (temperature change). As a result, the light emitting apparatus of the embodiment has high reliability without breaking wires.

In the light emitting apparatus of the embodiment, since the insulating resin is formed so that the distal end of the guide wall is located at a position lower than the upper surface 107a of the heat dissipating member 107, the light emitted by the light emitting device 110 can emerge to the outside of the insulating resin 116 without being blocked.

The components of the light emitting apparatus of the embodiment will now be described in detail including the manufacturing method.

In the embodiment, the first and second leads each having the inner lead and the outer lead and the metal tab 105 that has the aperture 106 are made by punching through thin metal sheets.

The heat dissipating member 107 comprises the upper surface 107a and a lower surface 107e which oppose each other and the outer circumferential side face that has a first step 107b and a second step 107c, and is made by press-forming, for example, a cylindrical material made of copper.

The portion of the heat dissipating member 107 located above the first step 107b is inserted into the aperture 106 of the metal tab 105. Then the first and second leads 23a, 23b are placed at predetermined positions within a molding die and the insulating resin is injected into a cavity (injection molding process). This results in such a construction as the first and second leads 23a, 23b are held outside of the metal tab 105 while being electrically isolated by the insulating resin from the metal tab 105 and the heat dissipating member 107. In the embodiment, the inner lead 102 is provided so as to be electrically isolated by the insulating resin at a position above the second step 107c.

In this specification, reference to the inner lead 102 means both the inner lead 102a and the inner lead 102b.

After placing the metal tab 105 and the first and second leads 23a, 23b as described above, the light emitting device 110 is mounted on the upper surface (device mounting area) 107a of the heat dissipating member 107, the protective device 111 is mounted on the metal tab 105 and predetermined wirings are provided by a wire bonding process.

Specifically, electrical connections are established between the light emitting device 110 and the inner lead 102, between the protective device 111 and the inner lead 102a and between the metal tab 105 and the inner lead 102b by means of wires.

The portion of the lead that extends outward from the insulating resin 115 is referred to as the outer lead, and the portion contained within the insulating resin 115 is referred to as the inner lead.

The light emitting diode 110 is covered with the translucent cover member 116.

In this constitution, the translucent cover member 116 is formed in a semi-spherical shape so as to fill the recess that surrounds the heat dissipating member 107 and cover the guide wall of the molding resin 115, with the radius of the semi-sphere being set so as to obtain a predetermined optical directivity.

In the constitution described above, the heat dissipating member 107 and the metal tab 105 do not make contact with the inner lead 102, thereby isolating the route of heat dissipation and the current path.

The metal tab 105 preferably has the aperture 106 located at the center thereof as in the case of the embodiment, and it is further preferable that the aperture 106 has a shape that matches the shape of the heat dissipating member 107. However, the present invention is not limited to this configuration and any other shape may be employed according to the purpose. For example, the aperture 106 may have such a shape as a circle, an ellipse, a square or a rectangle, when viewed from above. The metal tab 105 contacts the heat dissipating member 107. The metal tab 105 may have any shape as long as the aperture wherein the heat dissipating member 107 is mounted can be provided, such as a C shape or a U shape when viewed from above.

The heat dissipating member 107 is preferably formed in a stepwise construction having at least the top surface (which corresponds to the device mounting area 107a), the mid level (first step) 107b and the bottom level (second step) 107c as described in the embodiment. It is preferable that the heat dissipating member 107 becomes wider from the top surface 107a toward the bottom level (second step) 107c. The size (area) of the top surface 107a is preferably roughly equal to or less than the size (area) of the aperture 106 of the tab 105. Making the size of the top surface 107a roughly equal to the size of the aperture 106 enables preventing the heat dissipating member 107 from coming off. Providing the mid level (first step) 107b in the heat dissipating member 107 enables preventing the heat dissipating member 107 from coming off the metal tab 105. According to the present invention, it is preferable to form a protrusion right above the mid level 107b on the side face of the heat dissipating member 107 as shown in FIG. 2, which makes it possible to hold the tab 105 between the protrusion and the mid level 107b. Providing the mid level 107b also increases the contact area between the heat dissipating member 107 and the tab 105. Providing the bottom level 107c of the heat dissipating member 107 enables keeping a large contact area with the insulating resin 115 without putting the heat dissipating member 107 into contact with the inner lead 102.

It is preferable that the upper surface (the device mounting area) 107a of the heat dissipating member 107 protrudes beyond the tab 105 as shown in the embodiment. With this configuration, light emitted by the light emitting diode 110 is not blocked by the protective device 111 when the light emitting diode 110 is mounted on the device mounting area 107a and the protective device 111 is mounted on the tab 105. Also it makes it possible to more effectively prevent the heat dissipating member 107 from coming off the metal tab 105.

It is preferable that the device mounting area 107a of the heat dissipating member 107 protrudes beyond the insulating resin 115 as shown in the embodiment. With this configuration, light emitted by the light emitting diode 110 sideways can emerge to the outside without being blocked by the insulating resin 115.

It is preferable that the side face 107d of the heat dissipating member 107 has a protrusion or a recess for the prevention of the tab 105 from coming off as shown in the embodiment. The protrusion is formed on the side face 107d by applying a mechanical force with a punch or the like from above the heat dissipating member 107 as described in relation to the method of manufacturing the semiconductor apparatus of the embodiment. Besides processing the heat dissipating member 107, a ring may be formed from another material to prevent the tab 105 from coming off. The heat dissipating member 107 may also be prevented from coming off the tab 105 by providing a recess in the side face 107d of the heat dissipating member 107 and forming a mating protrusion on the tab 105.

It is preferable that the bottom surface 107e of the heat dissipating member 107 is exposed from the insulating resin 115 as shown in the embodiment, in order to improve the heat dissipating performance. Stability of a semiconductor apparatus 100[M3] may be improved by aligning the height of the lower surface 107e of the heat dissipating member 107 with an outer lead 103.

While electrical continuity between the protective device 111 and the inner lead 102 is established by means of the wire in the embodiment, the wire is bonded so that it does not pass over the light emitting diode 110. Accordingly, the wire that connects the protective device 111 and the inner lead 102 does not block the light emitted by the light emitting device and the wire is prevented from breaking. Also in the embodiment, connection between the protective device 111 and the inner lead 102 is provided via the shortest possible route, which prevents the wire from breaking more effectively. When a resin is used as the cover member 116, stress is generated when the resin is cured. When the wire passes over the light emitting diode 110, stress generated by the hardening of the resin may increase, thus causing the wire to break. Also because the wire does not pass over the light emitting diode 110, short-circuiting can be prevented from occurring between the wire that runs from the light emitting diode 110 and the wire that runs from the protective device 111.

In the embodiment, the metal tab 105 and the inner lead 102 are electrically connected to each other via the wire that is bonded so as not to pass over the light emitting diode 110. Since the metal tab 105 is disposed on the circumference of the heat dissipating member 107 and the inner lead 102 is disposed on the outside thereof, the protective device 111 and the inner lead 102 can be electrically connected to each other easily.

The cover member 116 is used to directly cover the light emitting diode 110 with the resin in the embodiment. Alternatively, a hollow cover may be used for covering. The cover member 116 preferably has a lens shape.

Such a semiconductor device 110 as described above can be provided.

While the light emitting diode 110 is used as the semiconductor device in the embodiment, the present invention is not limited to the light emitting diode, and another semiconductor device may be used.

First Variation

Figure 3:
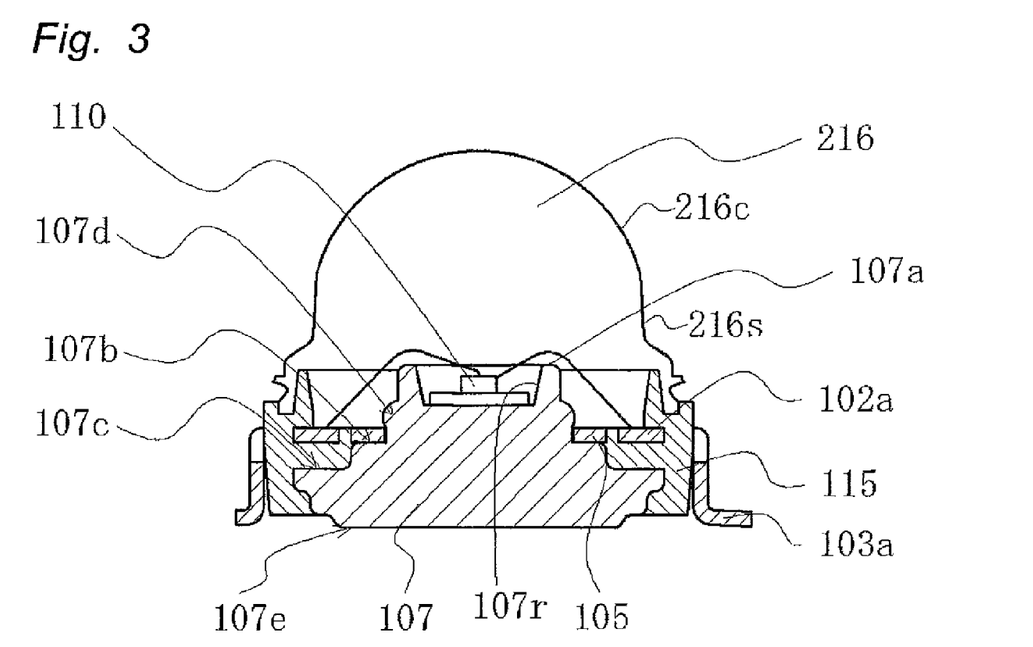
FIG. 3 is a sectional view showing the constitution of the light emitting apparatus according to a first variation of the present invention.

The light emitting apparatus of the first variation of the present invention is formed similarly to the embodiment, except for (1) the heat dissipating member 107 has a housing recess 107r for housing the light emitting device 110, (2) a translucent cover member 216 has a shape different from that of the translucent cover member 116, and (3) the protective device 111 is not provided on the metal tab (FIG. 3).

The light emitting apparatus of the first variation is a light emitting apparatus employing, for example, a semiconductor device that emits red light with a good voltage characteristic, where the protective device 111 is not provided.

The difference of this variation from the embodiment will now be described.

First, in the light emitting apparatus of the first variation, the heat dissipating member 107 has the housing recess 107r formed therein for housing the light emitting device 110 on the bottom surface of the housing recess 107r.

Also in the light emitting apparatus of the first variation, the translucent cover member 216 has a lens section having a spherical surface to function as a lens and a cylindrical section located below the spherical surface, so that the device can be mounted with high accuracy by providing the cylindrical section.

When the light emitting device is mounted by means of a mounter, forming the distal end (suction surface) of a suction nozzle in such a shape that has the inner surface which matches the outer circumferential surface 216s of the cylindrical section enables suction of the light emitting apparatus without tilting, thus achieving a high accuracy of mounting.

Second Variation

In the light emitting apparatus of the present invention, a flange may be formed on the metal tab.

A lead frame of the light emitting device according to the second variation will now be described with regard to the portion of the heat dissipating member.

Figure 4A:
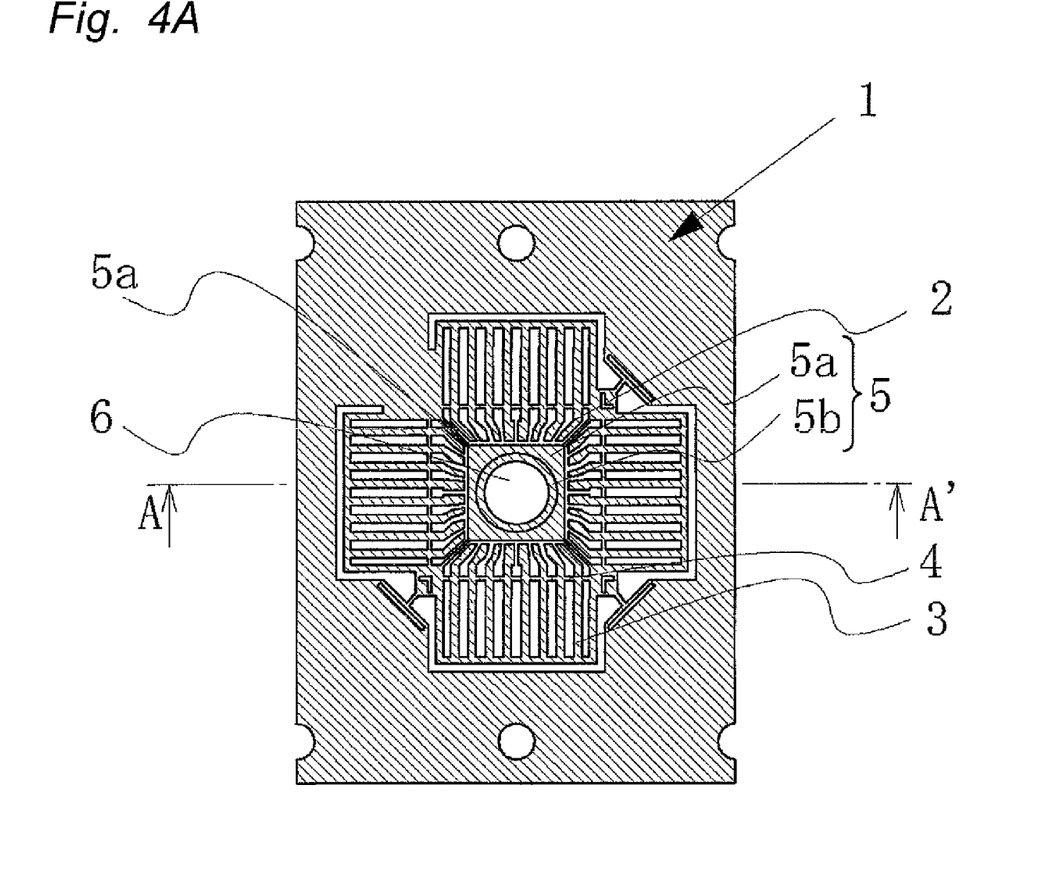
FIG. 4A is a front view of a lead frame according to variation 2.
Figure 4B:
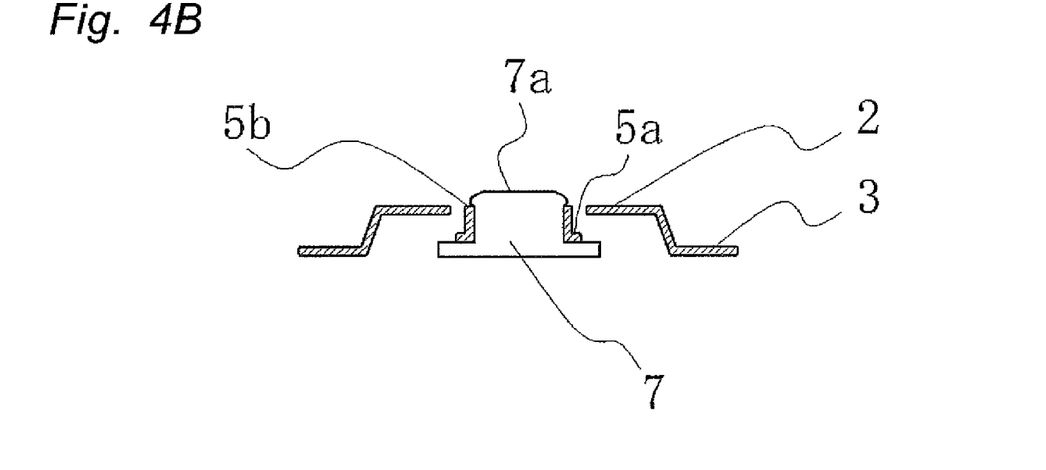
FIG. 4B is a sectional view along line A-A' of FIG. 4A.

FIG. 4A is a front view of the lead frame of the second variation, and FIG. 4B is a sectional view along line A-A' in FIG. 4.

A lead frame 1 made by punching through a thin metal sheet comprises the inner lead 2, the outer lead 3 that is electrically connected to the inner lead 2, and the tie bar 4 that mutually fastens the outer lead 3.

In this specification, the portion contained within the insulating resin is referred to as the inner lead 2, and the portion that is exposed from the insulating resin is referred to as the outer lead 3. The tie bar 4 is an ancillary means for tying the leads before molding with the resin, while the leads are to be separated and removed after molding with the resin.

A tab 5 is provided at roughly the center of the lead frame 1, and an aperture 6 is formed at the center of the tab 5. A heat dissipating member 7, that is formed from a material having high heat conductivity such as copper, copper alloy, aluminum or ceramics, is mounted by inserting into the aperture 6.

A flange 5a is formed at the aperture 6 of the tab 5 by a pressing operation called burring. The tab 5 consists of the flange 5a and a cylindrical section 5b.

By constituting the tab 5 from the flange 5a and the cylindrical section 5b, the contact area between the heat dissipating member 7 and the tab 5 can be increased, so that heat generated by the semiconductor device (not shown) that is mounted on the heat dissipating member can be efficiently removed through the two paths of the heat dissipating member 7 and the tab 5.

The tab 5 may be pressed down below the lead frame 1.

This configuration is convenient for the purpose of wire bonding to be described later.

The heat dissipating member 7 is mounted in the aperture 6 of the tab 5 with the device mounting area 7a facing upward. The semiconductor device is mounted on the device mounting area 7a, while the semiconductor device and the inner lead 2 are electrically connected to each other via a wire or the like.

At least the inner lead 2 and the heat dissipating member 7 are fastened by means of the insulating resin (not shown) before or after mounting the semiconductor device.

Thus a semiconductor apparatus having a high heat dissipating effect is provided.

(Method for Manufacturing Semiconductor Apparatus)

Figure 5A:
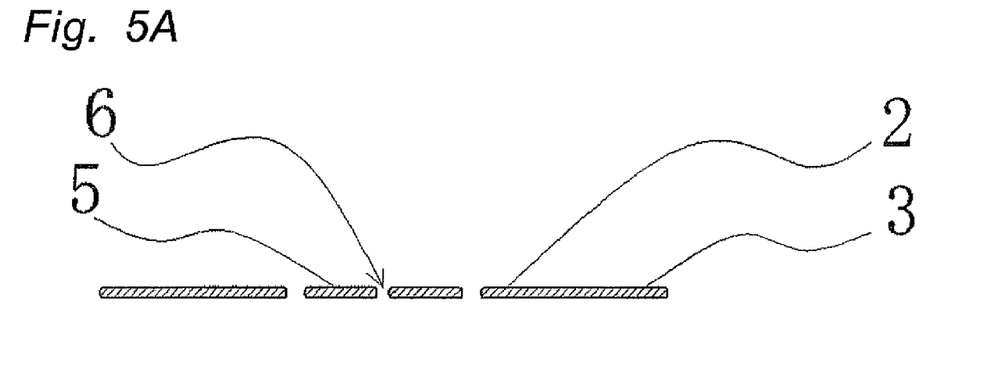
FIG. 5A is a sectional view of the lead frame according to second variation in a first step of the manufacturing process.
Figure 5B:
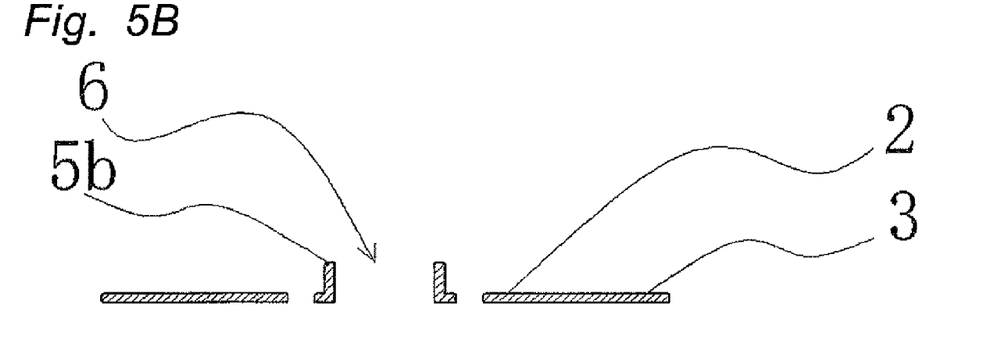
FIG. 5B is a sectional view of the lead frame according to the second variation in a second step of the manufacturing process.
Figure 5C:
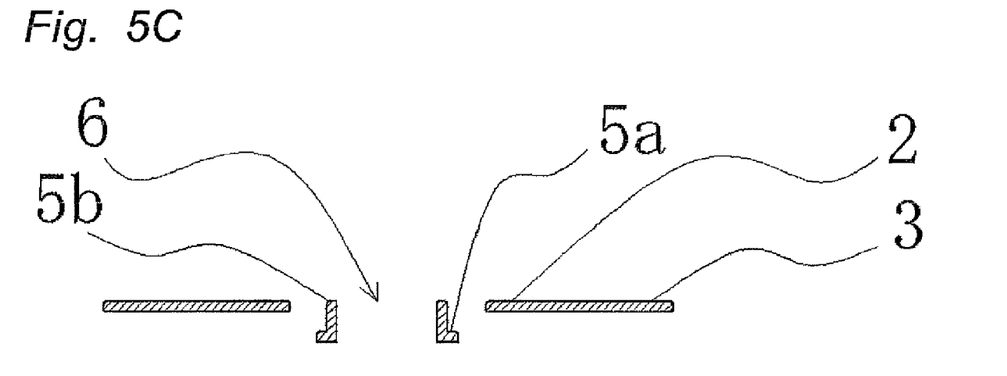
FIG. 5C is a sectional view of the lead frame according to the second variation in a third step of the manufacturing process.
Figure 5D:
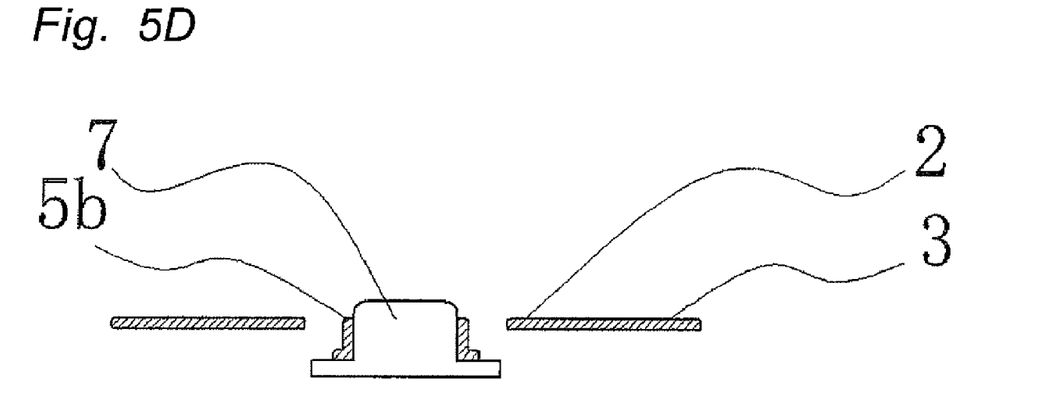
FIG. 5D is a sectional view of the lead frame according to the second variation in a fourth step of the manufacturing process.
Figure 5E:
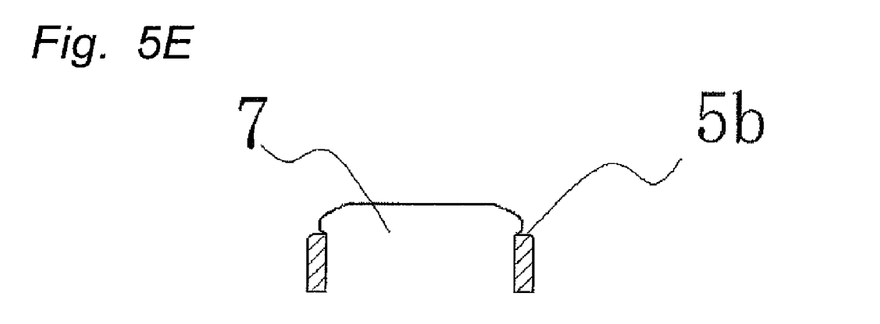
FIG. 5E is a sectional view of the lead frame according to the second variation in a fifth step of the manufacturing process.
Figure 6A:
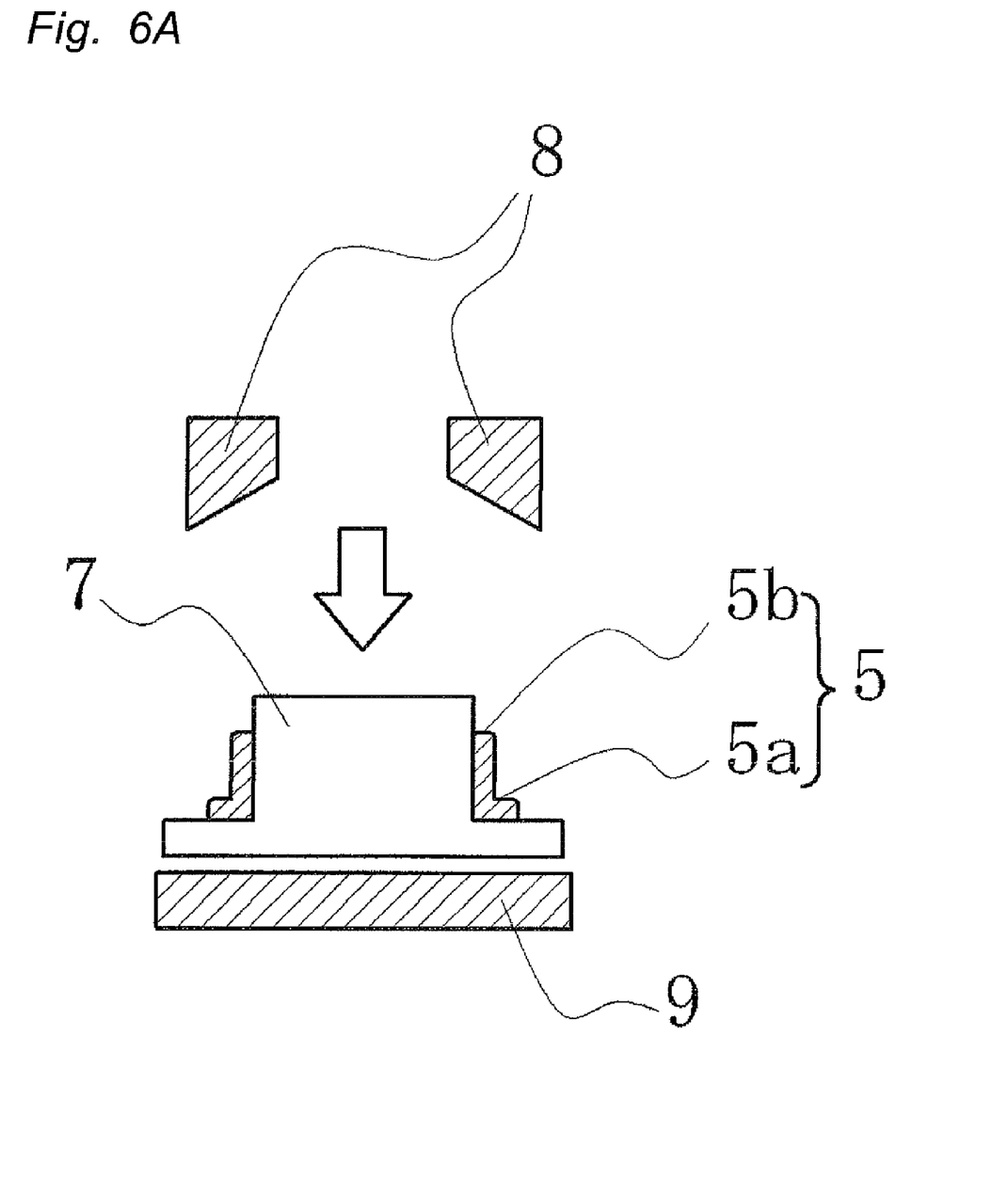
FIG. 6A is a sectional view of a step of deforming a heat dissipating member in the second variation.
Figure 6B:
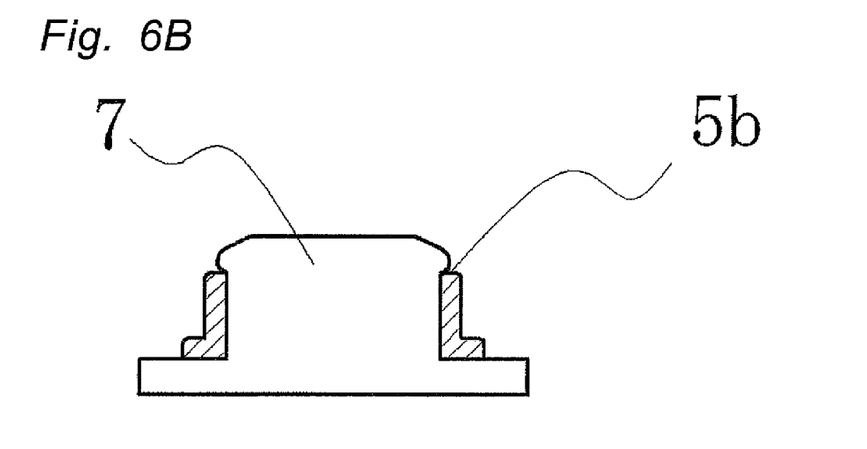
FIG. 6B is a sectional view of the heat dissipating member after being deformed in the second variation.

FIG. 5A through FIG. 5E are sectional views of successive steps in the process of manufacturing the lead frame according to the second variation. FIG. 6A and FIG. 6B are schematic sectional views of the tab and the heat dissipating member according to the second variation.

In FIG. 5A through FIG. 5E, the same components as those shown in FIG. 4A and FIG. 4B are identified with the same reference numerals and a description thereof is be omitted.

The inner lead 2, the outer lead 3, the tie bar 4, the tab 5 and the aperture 6 are formed by pressing or etching a thin metal sheet (not shown). The aperture 6 is formed in a circular or a rectangular shape so as to match the shape of the heat dissipating member 7 that is to be later inserted therein.

A burring process is applied to the aperture 6 by a press operation. This operation forms the flange 5a on the aperture 6 so as to extend from the aperture 6 either upward or downward. The flange 5a may be formed at right angles to the cylindrical section 5b or inclined therewith. This configuration prepares better conditions for inserting and fastening the heat dissipating member 7 later.

The tab 5 may also be pressed down below the lead frame. At this time, a reliable wire bonding operation can be ensured by aligning the upper surface of the heat dissipating member 7 to be inserted later in the tab 5 and the lead frame 1 in substantially the same plane.

In the second variation, the heat dissipating member 7 formed in a T shape with a single step formed thereon is inserted into the aperture 6. In this case, the heat dissipating member 7 is hammered down on the top surface thereof by the punch 8 for the purpose of caulking the tab 5 with the heat dissipating member 7.

The process of inserting the heat dissipating member 7 and caulking will now be described in detail with reference to FIG. 6A and FIG. 6B.

The tool used in the caulking operation comprises the punch 8 that has a flaring shape in the sectional view and the die 9 placed on a flat surface.

The die 9 is put into contact with the lower surface of the heat dissipating member 7, the slanted surface of the truncated chevron shaped punch 8 is placed on the upper surface of the heat dissipating member 7, and a pressure is applied to the upper edge thereby performing the caulking.

This method makes it possible to apply the force at the center of the tab 5 by means of the slanted surface formed on the punch 8, thereby improving the positional accuracy of the heat dissipating member 7.

As the edge (side face) of the heat dissipating member 7 is squeezed by the punch 8, a part of the material of the heat dissipating member 7 is forced to flow from the edge of the heat dissipating member 7 toward the tab 5 so as to clamp the flange 5a. Thus the tab 5 and the heat dissipating member 7 are held together by caulking. In this process, the heat dissipating member 7 is provided with a protrusion formed in the device mounting area.

Then the inner lead 2 and the heat dissipating member 7 are placed in a predetermined die that is then filled with the insulating resin. By hardening the resin, the inner lead 2 and the heat dissipating member 7 are fastened by means of the insulating resin. The semiconductor device is mounted on the device mounting area 7a of the heat dissipating member 7.

Alternatively, such a process may also be employed as, after mounting the semiconductor device mounted on the device mounting area 7a of the heat dissipating member 7, the inner lead 2 and the heat dissipating member 7 are placed in a predetermined die that is then filled with the insulating resin, with the resin being hardened so that the inner lead 2 and the heat dissipating member 7 are fastened by means of the insulating resin.

In the second variation, as described above, the aperture 6 is formed where a burring process is applied with the outer frame of the tab left inside of the tab of the lead frame, the heat dissipating member 7 is inserted into the aperture 6, and a mechanical force is applied onto the upper surface of the heat dissipating member 7 by means of the punch 8 or the like so as to attach the heat dissipating member 7 onto the top of the portion that has been processed by burring. Applying the burring process enables reducing the pressure acting on the lead frame during the pressure-attaching operation and integrating the heat dissipating member 7 and the lead frame together without causing deformation in the lead frame.

Applying the burring process to the lead frame also leads to the formation of R called a fillet at the position of the aperture 6 where the heat dissipating member 7 is to be inserted, so as to provide a guide for inserting the heat dissipating member 7. Due to the R, the heat dissipating member 7 can be inserted into the aperture without a special guide, thus reducing the manufacturing cost.

Also because the contact area between the heat dissipating member 7 and the lead frame increases when the heat dissipating member 7 is inserted into the aperture 6 that has been subjected to the burring process, the heat dissipating member 7 can be prevented from shaking, and also the heat dissipating member 7 can be prevented from tilting with respect to the normal direction of the aperture 6, thereby improving the positioning accuracy.

Also the increased contact area between the heat dissipating member 7 and the lead frame improves the heat dissipating capacity.

The light emitting device is used as the semiconductor device in the embodiment and the first and second variations. However, the present invention is not limited to the light emitting device and the semiconductor apparatus may be constituted from another semiconductor device such as, for example, a power transistor.

INDUSTRIAL APPLICABILITY

The semiconductor apparatus of the present invention can be used in lighting, a large backlight unit, a traffic signal light of a concentrated light source system, etc.

The invention claimed is:

1. A light emitting apparatus comprising:
   a light emitting device;
   a heat dissipating member that has an upper surface and a lower surface and supports the light emitting device mounted on the upper surface;
   first and second leads;
   an insulating resin that holds the first and second leads at positions separated from the heat dissipating member,
   a metal tab fitted into the circumference of the heat dissipating member; and
   a semiconductor device mounted on the surface of the metal tab,
   wherein an inner lead of the first lead and an inner lead of the second lead are held at positions lower than the upper surface and higher than the lower surface, and
   wherein an upper surface of the metal tab is different from the upper surface of the heat dissipating member on which the light emitting device is mounted, the upper surface of the metal tab being located at a position lower than the upper surface of the heat dissipating member, and
   wherein the metal tab and one of the inner leads are connected by a wire.

2. The light emitting apparatus according to claim 1, wherein the insulating resin have a guide wall that surrounds a portion of a side face of the heat dissipating member located above the inner lead of the first lead and the inner lead of the second lead, and that has a distal end located at a position lower than the upper surface of the heat dissipating member.

3. The light emitting apparatus according to claim 2; wherein the guide wall and the side face of the heat dissipating member form an annular recess that surrounds the heat dissipating member, and
   wherein the surface of the inner lead of the first lead, the surface of the inner lead of the second lead and the surface of the metal tab are placed at the bottom of the recess.

4. The light emitting apparatus according to claim 1, wherein a housing recess for housing the light emitting device is formed on the upper surface of the heat dissipating member.

5. The light emitting apparatus according to claim 1, further comprising a translucent cover member that covers the light emitting device, wherein at least a part of the surface of the translucent cover member is a spherical surface.

6. The light emitting apparatus according to claim 1, wherein a portion of the translucent cover member below the spherical surface is a cylindrical shape.

7. A semiconductor apparatus comprising:
   a semiconductor device;
   a heat dissipating member whereon the semiconductor device is mounted;
   leads that are electrically connected to the semiconductor device;
   a tab having an aperture formed therein into which the heat dissipating member is inserted, wherein an upper surface of the tab is different from the upper surface of the heat dissipating member on which the semiconductor device is mounted, the upper surface of the tab being located at a position lower than the upper surface of the heat dissipating member, wherein the tab and one of the leads are connected by a wire; and an insulating resin that allows one end of the leads to be exposed therefrom and fastens at least a part of the leads and the heat dissipating member therein, wherein a protective device is mounted on the tab, the protective device and the leads are electrically connected to each other, and the heat dissipating member is mounted in the aperture of the tab.

8. The semiconductor apparatus according to claim 7, wherein the tab is not in contact with the lead.

9. The semiconductor apparatus according to claim 8, wherein the protective device and the leads are electrically connected to each other via a wire that does not pass over the semiconductor device.

10. The semiconductor apparatus according to claim 7, wherein the protective device and the leads are electrically connected to each other via a wire that does not pass over the semiconductor device.

11. The semiconductor apparatus according to claim 7, wherein the tab and the leads are electrically connected to each other via a wire which does not pass over the semiconductor device.

12. The semiconductor apparatus according to claim 7, wherein the heat dissipating member has a stepwise construction having at least a top level, a mid level and a bottom level, where the top level preferably has a size substantially the same as or less than that of the aperture of the tab.

13. The semiconductor apparatus according to claim 7, wherein the heat dissipating member has a device mounting area where the semiconductor device is mounted, and the device mounting area protrudes beyond the tab.

14. The semiconductor apparatus according to claim 7, wherein the heat dissipating member has a device mounting area where the semiconductor device is mounted, and the device mounting area protrudes beyond the insulating resin.

15. The semiconductor apparatus according to claim 7, wherein the side face of the heat dissipating member has a protrusion or a recess formed thereon so as to prevent the tab from coming off.

16. The semiconductor apparatus according to claim 7, wherein the lower surface of the heat dissipating member is exposed from the insulating resin.

* * * * *